US010879089B2

(12) United States Patent
Umeki

(10) Patent No.: US 10,879,089 B2
(45) Date of Patent: Dec. 29, 2020

(54) CERAMIC HEATER

(71) Applicant: NGK SPARK PLUG CO., LTD., Nagoya (JP)

(72) Inventor: Toshiya Umeki, Sendai (JP)

(73) Assignee: NGK SPARK PLUG CO., LTD., Nagoya (JP)

(*) Notice: Subject to any disclaimer, the term of this patent is extended or adjusted under 35 U.S.C. 154(b) by 84 days.

(21) Appl. No.: 16/395,587

(22) Filed: Apr. 26, 2019

(65) Prior Publication Data
US 2019/0341279 A1 Nov. 7, 2019

(30) Foreign Application Priority Data

May 1, 2018 (JP) ................................ 2018-087990

(51) Int. Cl.
H01L 21/683 (2006.01)
H01L 21/67 (2006.01)
(Continued)

(52) U.S. Cl.
CPC .... H01L 21/67103 (2013.01); H01L 21/6833 (2013.01); H01L 21/6875 (2013.01);
(Continued)

(58) Field of Classification Search
CPC ........... H01L 21/67103; H01L 21/6833; H01L 21/68785; H01L 21/6831; H01L 21/683;
(Continued)

(56) References Cited

U.S. PATENT DOCUMENTS

2003/0186183 A1* 10/2003 Ito ...................... H01L 21/6831
432/253
2004/0035846 A1* 2/2004 Hiramatsu ........ H01L 21/67109
219/444.1
(Continued)

FOREIGN PATENT DOCUMENTS

JP 2017-174713 A 9/2017
JP 2017174713 A * 9/2017
(Continued)

OTHER PUBLICATIONS

Korean Intellectual Property Office, Office Action (Notification of Reason for Refusal) issued in corresponding Application No. 10-2019-0039104, dated Oct. 28, 2020.

Primary Examiner — Thienvu V Tran
Assistant Examiner — Shahzeb K Ahmad
(74) Attorney, Agent, or Firm — Stites & Harbison, PLLC; Jeffrey A. Haeberlin

(57) ABSTRACT

Disclosed is a ceramic heater, which includes: a disc-shaped ceramic substrate with top and bottom surfaces; and a planar electrode and first and second heating resistors embedded in the ceramic substrate in this order from top to bottom. In top view, the first heating resistor has: a planer first resistive portion arranged inside a first imaginary circle defined by an outermost circumferential contour of the planer electrode; a linear or strip-shaped second resistive portion arranged outward of the first resistive portion in a radial direction of the ceramic substrate and extending along a circumferential direction of the ceramic substrate; and a connecting portion connecting the first and second resistive portions to each other; and the second heating resistor is arranged inside a second imaginary circle defined by an innermost circumferential contour of the second resistive portion.

3 Claims, 9 Drawing Sheets

(51) Int. Cl.
  *H05B 3/28*        (2006.01)
  *H01L 21/687*      (2006.01)
(52) U.S. Cl.
  CPC ....... *H01L 21/68785* (2013.01); *H05B 3/283*
        (2013.01); *H05B 2203/002* (2013.01); *H05B*
                                  *2203/005* (2013.01)
(58) Field of Classification Search
  CPC . H01L 21/687; H05B 3/283; H05B 2203/005;
          H05B 2203/002; C04B 35/62695; C04B
                  35/62675; H01C 7/046; H01C 7/045
  See application file for complete search history.

(56)              References Cited

U.S. PATENT DOCUMENTS

2004/0188413 A1*  9/2004  Natsuhara ......... H01L 21/67109
                                                    219/444.1
2005/0258160 A1* 11/2005  Goto ................. H01L 21/67103
                                                    219/270
2017/0110357 A1*  4/2017  Ishikawa ............ H01L 21/6833
2018/0096868 A1*  4/2018  Kitabayashi ........... H05B 3/283

FOREIGN PATENT DOCUMENTS

JP       2018-005999 A     1/2018
KR    10-2008-0037879 A    5/2008

\* cited by examiner

CERAMIC HEATER

FIELD OF THE INVENTION

The present invention relates to a ceramic heater for heating a heating target object such as semiconductor wafer.

BACKGROUND OF THE INVENTION

A multi-zone ceramic heater has been proposed, which includes: a ceramic substrate having a top surface on which a heating target object (such as semiconductor wafer) to be subjected to film-forming process, etching process or any other treatment process is mounted; and a plurality of separate heating resistors respectively embedded in a plurality of divided zones of the ceramic substrate such that currents supplied to the heating resistors are independently controlled.

Conventionally, the heating resistor has: first resistive elements connected to power supply terminals; second resistive elements respectively connected to the first resistive elements and disposed in an annular or multiple annular arrangement around the first resistive elements; and third resistive elements each connecting adjacent ones of the second resistive elements.

For example, Japanese Laid-Open Patent Publication No. 2017-174713 discloses a multi-zone ceramic heater in which three heating circuits (as heating resistors) are embedded in layers for individual heating control of three divided zones. In this ceramic heater, each of the heating circuits is arranged as mentioned above.

SUMMARY OF THE INVENTION

In the above conventional ceramic heater, the first resistive element of the heating resistor is linear or strip-shaped so that local heat generation is caused by the electrical resistance of the first resistive element. It is thus difficult to achieve uniformity of heat on the ceramic substrate even by controlling heat generated from the other heating resistor that overlaps such a local heat generation region.

In order to suppress local heat generation caused by the first resistive element, it is conceivable to control and uniformize generation of heat from the first resistive element by increasing the occupation area of the first resistive element. In this case, however, the attraction-function-type ceramic heater in which an electrostatic attraction electrode or high-frequency generation electrode is embedded in the ceramic substrate at a position above the top-side heating resistor faces the problem that the top-side heating resistor fails to show a desired resistance value whereby the target object cannot be heated in a desired state.

The present invention has been made in view of the above circumstances. It is an object of the present invention to provide a ceramic heater capable of heating a heating target object in a desired state.

According to one aspect of the present invention, there is provided a ceramic heater, comprising: a ceramic substrate formed of a ceramic material in a circular disc shape with top and bottom surfaces; a planar electrode embedded in the ceramic substrate and configured as an electrostatic attraction electrode or a high-frequency generation electrode; a first heating resistor embedded in the ceramic substrate at a position closer to the bottom surface of the ceramic substrate than the planer electrode; and a second heating resistor embedded in the ceramic substrate at a position closer to the bottom surface of the ceramic substrate than the first heating resistor, wherein the first heating resistor has, in top view, a planer first resistive portion arranged in an inner region inside a first imaginary circle defined by an outermost circumferential contour of the planer electrode, a linear or strip-shaped second resistive portion arranged in the inner region at a location outward of the first resistive portion in a radial direction of the ceramic substrate and extending along a circumferential direction of the ceramic substrate, and a connecting portion connecting the first resistive portion and the second resistive portion to each other, and wherein, in top view, the second heating resistor is arranged inside a second imaginary circle defined by an innermost circumferential contour of the second resistive portion.

In the present aspect, the first resistive portion is arranged in a planer shape as mentioned above. In the conventional ceramic heater, by contrast, the first resistive portion (first resistive element) is arranged in a linear or strip shape. The occupation area of the first resistive portion is hence made larger in the present aspect than in the conventional ceramic heater. With such a large occupation area, the electrical resistance of the first resistive portion is lowered so as to suppress heat generation in the region in which the first resistive portion is arranged. The ceramic heater of the present aspect therefore achieves uniformity of heat on the ceramic heater.

Herein, the ceramic substrate is formed by sintering a powder of the ceramic material with the electrode and the heating resistors being embedded in the powder of the ceramic material. During the sintering, a carbon component contained in the ceramic material is reacted with the electrode and the heating resistors. Consequently, the heating resistors show respective desired resistance values.

In the case where the second heating resistor is sandwiched between the planer electrode and the planer first resistive portion of the first heating resistor, a large amount of carbon component present in the vicinity (above and below) of the second heating resistor is consumed by reaction with the planer electrode and the planer first resistive portion so that the second heating resistor fails to show a desired resistance value due to less amount of carbon component reacted with the second heating resistor.

In the present aspect, however, no planer electrode and no planer heating resistor are present below the second heating resistor. As sufficient carbon component is reacted with the second heating resistor without being consumed by the planer electrode and the planer heating resistor, the second heating resistor shows a desired resistance value.

It is preferable in the present aspect that, in top view, the first resistive portion includes a plurality of sections having respective contour lines along a circumference of a circle coaxial with the ceramic substrate and being electrically connected to each other via the second resistive portion and the connection portion.

It is also preferable in the present aspect that, in top view, a total area of the first resistive portion is 50% or larger assuming that an area of a third imaginary circle defined by an outermost circumferential contour of the first resistive portion is 100%.

The other objects and features of the present invention will also become understood from the following description.

DESCRIPTION OF EMBODIMENTS

Hereinafter, a ceramic heater 100 according to one exemplary embodiment of the present invention will be described in detail below.

The basic structure of the ceramic heater 100 will be first explained below with reference to FIGS. 1 to 3.

Figure 1:
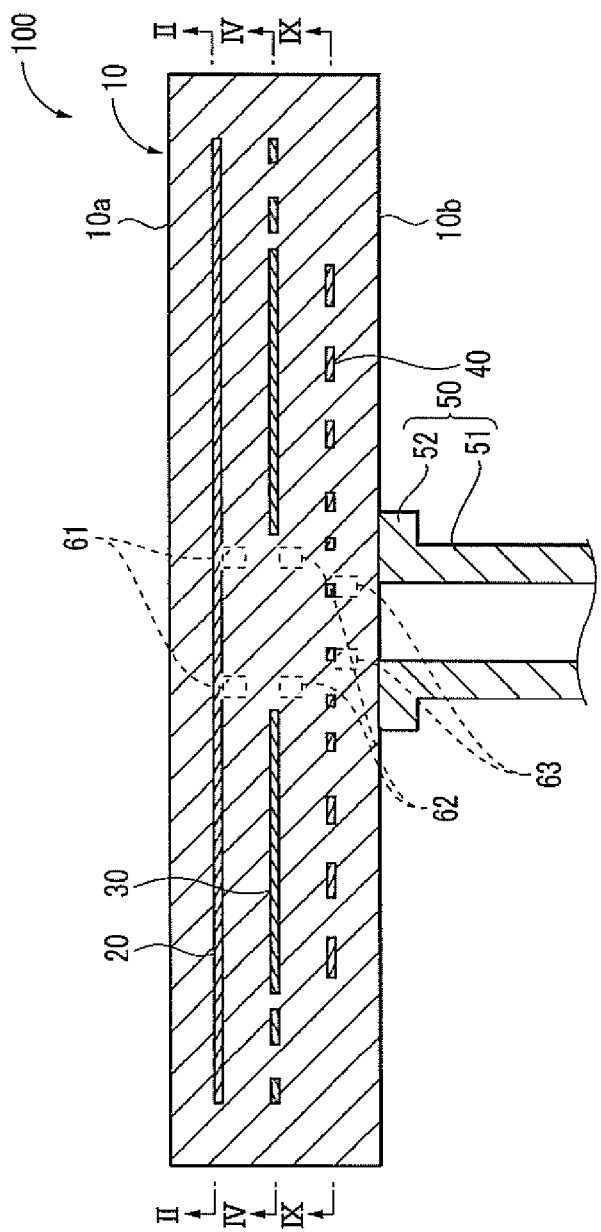
FIG. 1 is a schematic cross-sectional view of a ceramic heater according to one exemplary embodiment of the present invention.

As shown in FIG. 1, the ceramic heater 100 includes: a ceramic substrate 10 formed in a circular disc shape with two opposite top and bottom (front and back) surfaces 10a and 10b such that a heating target object such as wafer (not shown) is mounted and held by attraction onto the top surface 10a; a planar electrode 20 and top- and bottom-side heating resistors 30 and 40 embedded in the ceramic substrate 10 so as not to be short-circuited to one another, and a hollow shaft 50 joined to a center portion of the bottom surface 10b of the ceramic substrate 10.

In the present embodiment, the top-side heating resistor 30 corresponds to the claimed first heating resistor; and the bottom-side heating resistor 40 corresponds to the claimed second heating resistor.

The ceramic substrate 10 is formed as a sintered compact of ceramic material such as alumina, aluminium nitride, silicon nitride or the like. The ceramic substrate 10 can be formed by molding a powder of the above ceramic material in a mold of desired shape and subjecting the resulting molded body to hot-press compaction sintering.

Various additives such as sintering aid are added to the ceramic material powder as the raw material of the ceramic substrate 10. In the case of using an aluminum nitride (AlN) powder as the raw material of the ceramic substrate 10, for example, it is preferable to add yttrium oxide ($Y_2O_3$) as an additive in order to improve the thermal-conductivity of the ceramic substrate 10.

The ceramic material powder may be subjected to granulation with an organic solvent. In this case, a carbon component derived from the organic solvent is slightly contained in the molded body of the ceramic material powder and remains even after the sintering.

Further, the ceramic material powder may be mixed with an organic binder and then molded into a desired shape. In this case, a carbon component derived from the organic binder is slightly contained in the molded body of the ceramic material powder and remains even after the dewaxing and sintering.

The shaft 50 is substantially cylindrical-shaped, and has a cylindrical portion 51 and an enlarged diameter portion 52 made large in diameter than the cylindrical portion 51 and joined at a top end surface thereof to the bottom surface 10b of the ceramic substrate 10.

The shaft 50 can be formed of the same kind of material as the ceramic substrate 10. Alternatively, the shaft 50 can be formed of a material lower in thermal conductivity than that of the ceramic substrate 10 in order to increase the thermal insulation properties of the shaft 50.

The bottom surface 10b of the ceramic substrate 10 and the top end surface of the shaft 50 are joined together by diffusion bonding or solid phase bonding using a bonding agent (such as ceramic, glass or the like). Alternatively, the ceramic substrate 10 and the shaft 50 may be joined together by screw fixing, brazing or the like.

The ceramic heater 100 further includes: a pair of electrode terminals 61 for power supply to the planer electrode 20; a pair of top-side heating resistor terminals 62 for power supply to the top-side heating resistor 30; and a pair of bottom-side heating resistor terminals 63 for power supply to the bottom-side heating resistor 40.

The terminals 61, 62 and 63 are respectively connected to power supply members (not shown) which are embedded in the ceramic substrate 10. Power supply lines (not shown) which pass through the hollow of the shaft 50 are connected at one ends thereof to the power supply members and at the other ends thereof to power source.

The terminal 61, 62, 63 and the power supply member are connected to each other by brazing or welding. Each of the terminals 61, 62 and 63 is formed of a foil, plate or bulk of heat-resistant metal material such as Ni (nickel), Kovar (registered trademark; Fe—Ni—Co alloy), molybdenum (Mo), tungsten (W), or a heat-resistant alloy containing molybdenum (Mo) and tungsten (W) as predominant components. On the other hand, each of the power supply members is formed of e.g. molybdenum (Mo) or tungsten (W).

The electrode 20 is configured as an electrostatic attraction electrode (see FIG. 3) for attracting the heating target object onto the top surface 10a of the ceramic substrate 10 by Johnson-Rahbek force or Coulomb force, or a high-frequency generation electrode (called "radio frequency (RF) electrode") (see FIG. 2) for generating a plasma above the top surface 10a of the ceramic substrate 10. In the present embodiment, the electrode 20 is formed from a foil or mesh of heat-resistant metal material such as molybdenum (Mo) or tungsten (W) in a planar shape.

The top-side heating resistor 30 is embedded in the ceramic substrate 10 at a position closer to the bottom surface 10b of the ceramic substrate 10 than the electrode 20; whereas the bottom-side heating resistor 40 is embedded in the ceramic substrate 10 at a position closer to the bottom surface 10b of the ceramic substrate 10 than the top-side heating resistor 30.

Each of the heating resistors 30 and 40 is formed from a mesh of heat-resistant metal material such as molybdenum (Mo) or tungsten (W). The heating resistor 30, 40 may alternatively be formed from any other layer (such as film, plate, wire, foil, fabric, coil or ribbon) of heat-resistant metal material. Furthermore, each of the heating resistors 30 and 40 is entirely made uniform in thickness in the present embodiment.

The ceramic substrate 10 is formed by sintering the ceramic powder material as the raw material of the ceramic substrate 10 to which the additives have been added, with the electrode 20 and the heating resistors 30 and 40 being embedded in the ceramic powder material.

Figure 2:
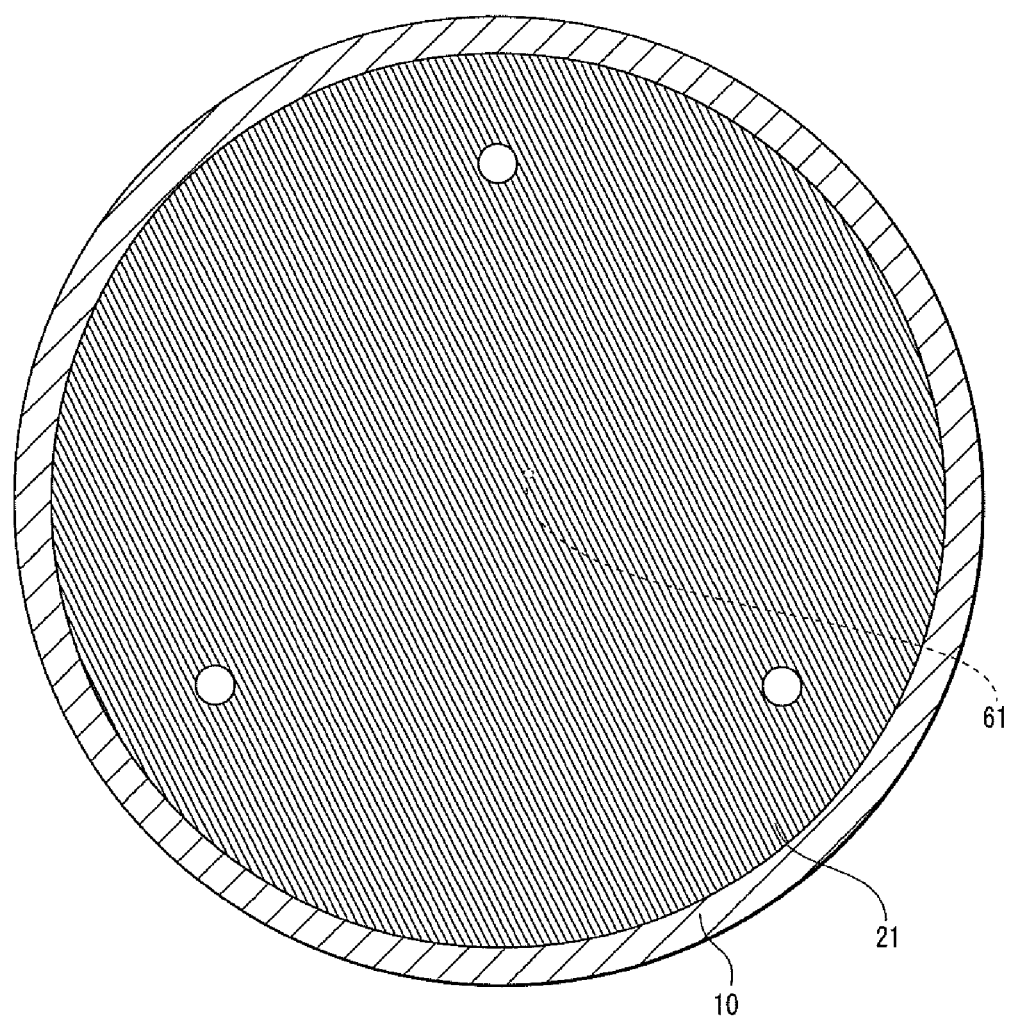
FIG. 2 is a schematic cross-sectional view of the ceramic heater as taken along line II-II of FIG. 1 in the case of using a high-frequency generation electrode as an electrode of the ceramic heater.

In the case where the electrode 20 is configured as a high-frequency generation electrode, the electrode 20 has a circular disc-shaped electrode element 21 connected to the respective electrode terminals 61 as shown in FIG. 2. The electrode 20 as the high-frequency generation electrode is however not limited to such a configuration as long as the electrode 20 has a single continuous area and, in top view, occupies the major part of the inside of the ceramic substrate 10.

Figure 3:
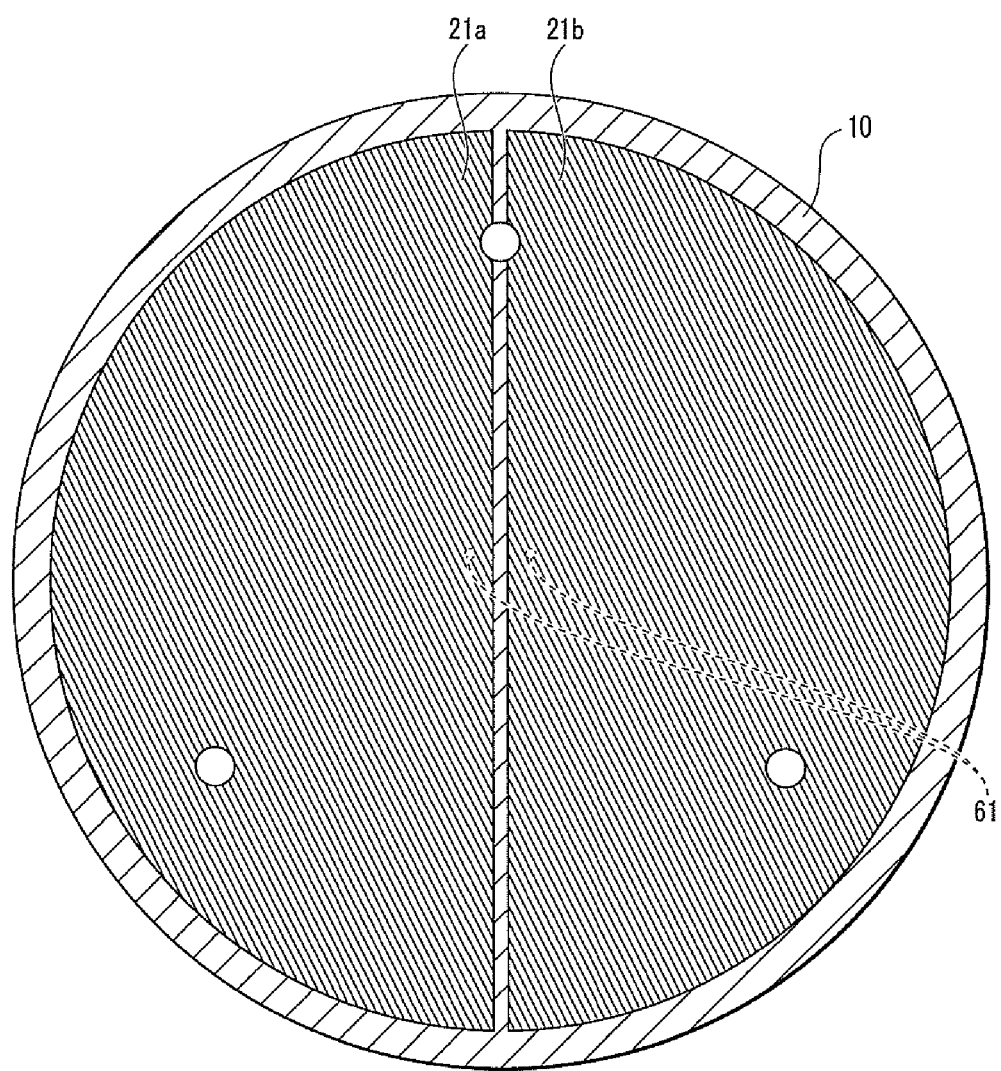
FIG. 3 is a schematic cross-sectional view of the ceramic heater as taken along line II-II of FIG. 1 in the case of using an electrostatic attraction electrode as an electrode of the ceramic heater.

In the case where the electrode 20 is configured as an electrostatic attraction electrode, the electrode 20 has two substantially semicircular plate-shaped electrode elements 21a and 21b connected to the respective electrode terminals 61 as shown in FIG. 3. The electrode 20 as the electrostatic attraction electrode is however not limited to such a configuration as long as the electrode 20 has two electrically independent electrode elements and, in top view, occupies the major part of the inside of the ceramic substrate 10. The number of electrode elements in the electrode 20 is not limited to two. The electrode 20 may have one electrode element that, in top view, occupies the major part of the inside of the ceramic substrate 10. The electrode terminal 61 is provided to each electrode element.

In the present embodiment, three holes are formed through the ceramic substrate 10 in a thickness direction thereof at distinct positions on the same circle. The electrode 20 is arranged avoiding these three holes as shown in FIGS. 2 and 3.

Next, the configuration of the top-side heating resistor 30 will be explained in more detail below with reference to FIGS. 4 to 8.

Figure 4:
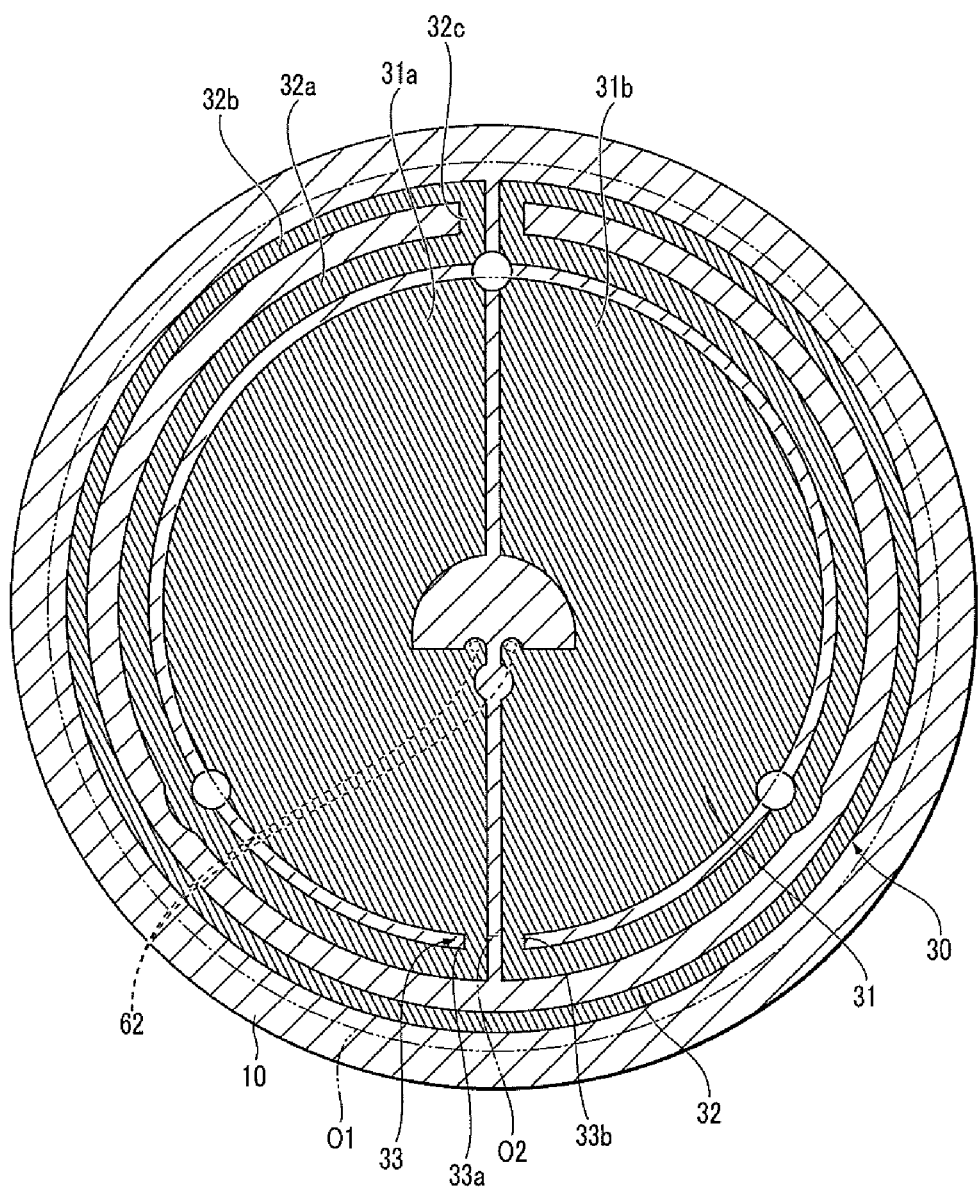
FIG. 4 is a schematic cross-sectional view of the ceramic heater as taken along line IV-IV of FIG. 1.

As shown in FIG. 4, the top-side heating resistor 30 includes, in top view, a planner top-side first resistive portion 31 arranged in an inner region inside an imaginary circle O1 defined by an outermost circumferential contour of the electrode 20, a linear or strip-shaped top-side second resistive portion 32 arranged in the inner region at a location outward of the top-side first resistive portion 31 in a radial direction of the ceramic substrate 10 and extending along a circumferential direction of the ceramic substrate 30, and a top-side connecting portion 33 connecting the top-side first resistive portion 31 and the top-side second resistive portion 32 to each other. In the present embodiment, the top-side first resistive portion 31 corresponds to the claimed first resistive portion; the top-side second resistive portion 32 corresponds to the claimed second resistive portion; and the top-side connecting portion 33 corresponds to the claimed connecting portion.

More specifically, the top-side first resistive portion 31 has two top-side first resistive elements 31a and 31b formed in a substantially semicircular plate-shape and respectively connected to the top-side heating resistor terminals 62. In top view, the top-side first resistive elements 31a and 31b have respective circumferential contour lines along the circumference of an imaginary circle O2 coaxial with the disc-shaped ceramic substrate 10. In other words, the circumferential contour lines of the top-side first resistive elements 31a and 31 b constitute an outermost circumferential contour of the top-side first resistive portion 31, which defines the imaginary circle O2. These resistive elements 31a and 31b corresponds to the claimed plurality of sections in the present embodiment.

In top view, the total area of the top-side first resistive portion 31 is 50% or larger assuming that the area of the imaginary circle O2 is 100%.

The top-side second resistive portion 32 has: a top-side second resistive element 32a formed in a substantially annular strip shape, with parts thereof (on the upper and lower sides of FIG. 4) cut away, and disposed along a circle coaxial with the disc-shaped ceramic substrate 10 at a position apart from and around the top-side first resistive portion 31; a top-side second resistive element 32b formed in a substantially annular shape, with a part thereof (on the upper side of FIG. 4) cut away, and disposed along a circle coaxial with the disc-shaped ceramic substrate 10 at a position apart from and around the top-side second resistive elements 32a; and top-side connecting resistive elements 32c formed in a short, straight strip shape and respectively connecting adjacent radially opposed ends of the top-side second resistive elements 32a and 32b (on the upper side of FIG. 4). With this configuration, the top-side second resistive portion 32 is continuous without any of the elongated resistive elements 32a, 32b and 32c branching off.

The top-side connecting portion 33 has connecting resistive elements 33a and 33b formed in a short, straight strip shape and respectively connecting ends of the top-side second resistive element 32a (on the lower side of FIG. 4) to end parts of the top-side first resistive elements 31a and 31b adjacent thereto.

In top view, the top-side first resistive portion 31 is located so as to overlap the bottom-side heating resistor 40; the top-side second resistive portion 32 is located outward of the outermost circumferential contour of the bottom-side heating resistor 40 (so as not to overlap the bottom-side heating resistor 40).

More specifically, the top-side first resistive elements 31a and 31b are respectively arranged in regions except for a region that extends straightly with the same or similar width as the top-side second resistive portion 32 or the top-side connecting portion 33 and connects the top-side heating resistor terminals 62 to the top-side connecting portion 33. In top view, the top-side first resistive elements 31a and 31b occupy the substantially the whole area of the regions spaced at a predetermined distance from the top-side second resistive portion 32 and spaced from each other at a distance required for separation from the structure for electrical connection of the electrode terminals 61 to the power source or ground. The top-side heating resistor 30 is however arranged avoiding the above-mentioned three holes of the ceramic substrate 10.

The top-side first resistive element 31a, 31b is wide in area as mentioned above and thus is low in electrical resistance. Accordingly, the amount of Joule heat generated from the top-side first resistive element 31a, 31b by current supply thereto becomes small. This leads to the effect that, in the occupation region of the bottom-side heating resistor 40 (in top view), uniformity of heat would not be interfered with by heat generation from the top-side heating resistor 30.

As far as the above effect is exerted by the top-side first resistive element 31a, 31 b, the shape and form of the top-side first resistive elements 31a and 31b are not particularly limited.

The top-side heating resistor 30 is not limited to the above configuration. Various modifications of the top-side heating resistor 30 are possible as shown in FIGS. 5 to 8.

Although the top-side second resistive portion 32 has two top-side second resistive elements 32a and 32b in the present embodiment, the top-side second resistive portion 32 may alternatively have three or more top-side second resistive elements connected by connecting resistive elements.

Figure 5:
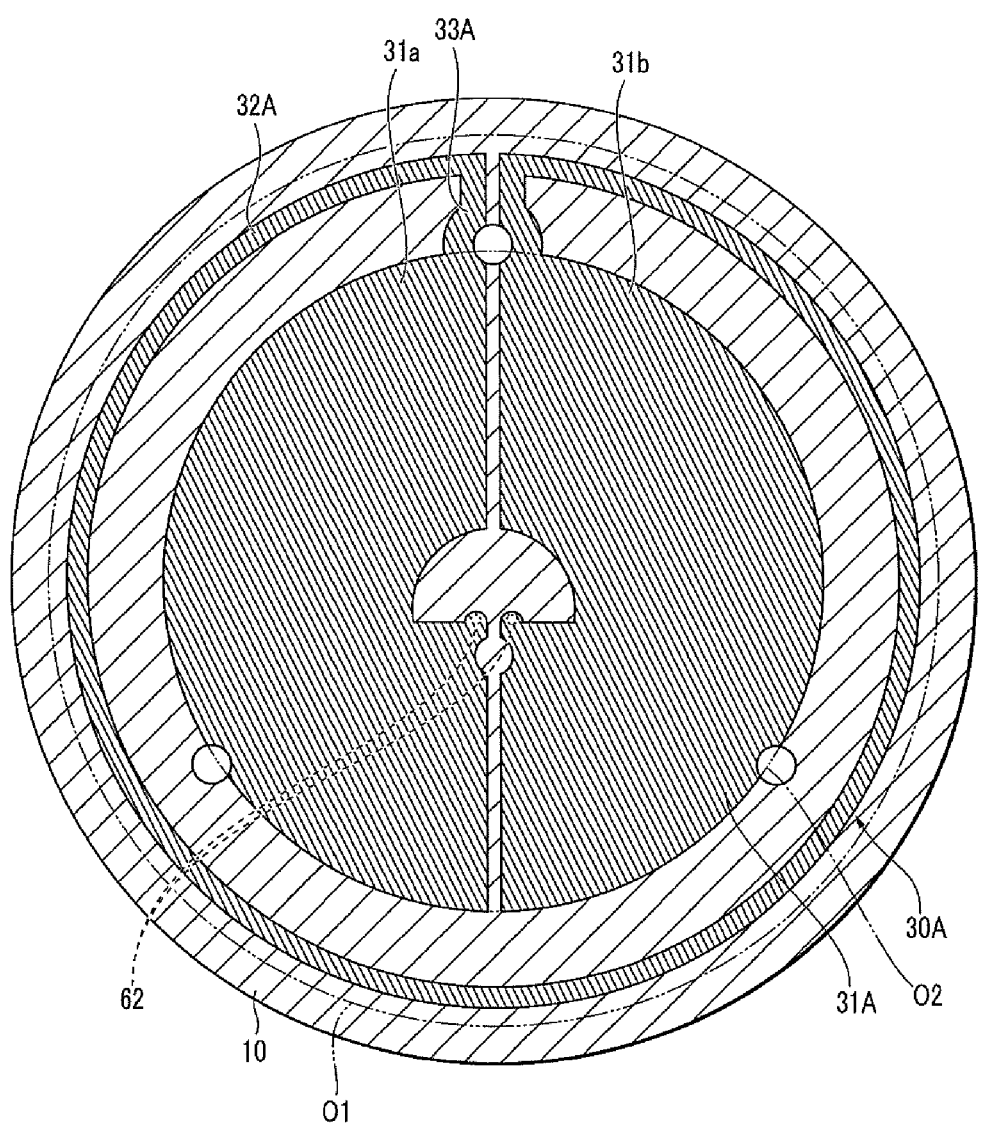
FIG. 5 is a schematic cross-sectional view of a modification of the ceramic heater as taken along line IV-IV of FIG. 1.

As a modification example, a top-side heating resistor 30A is provided as shown in FIG. 5, which includes: a top-side first resistive portion 31A having substantially semicircular plate-shaped first resistive elements 31*a* and 31*b* respectively connected to the top-side heating resistor terminals 62; a top-side second resistive portion 32A having one partially-cutaway annular second resistive element located radially outward of the top-side first resistive portion 31A; and a top-side connecting portion 33A connecting ends of the top-side second resistive portion 32A (on the upper side of FIG. 5) to end parts of the first resistive elements 31*a* and 31*b* adjacent thereto. The top-side second resistive portion 32A and/or the top-side connecting portion 33A may be in a bent or meandering shape although not specifically shown in the drawings.

Although the top-side first resistive portion 31 has two top-side first resistive elements 31*a* and 31 *b* in the present embodiment, the top-side first resistive portion 31 may alternatively have three or more top-side first resistive elements.

Figure 6:
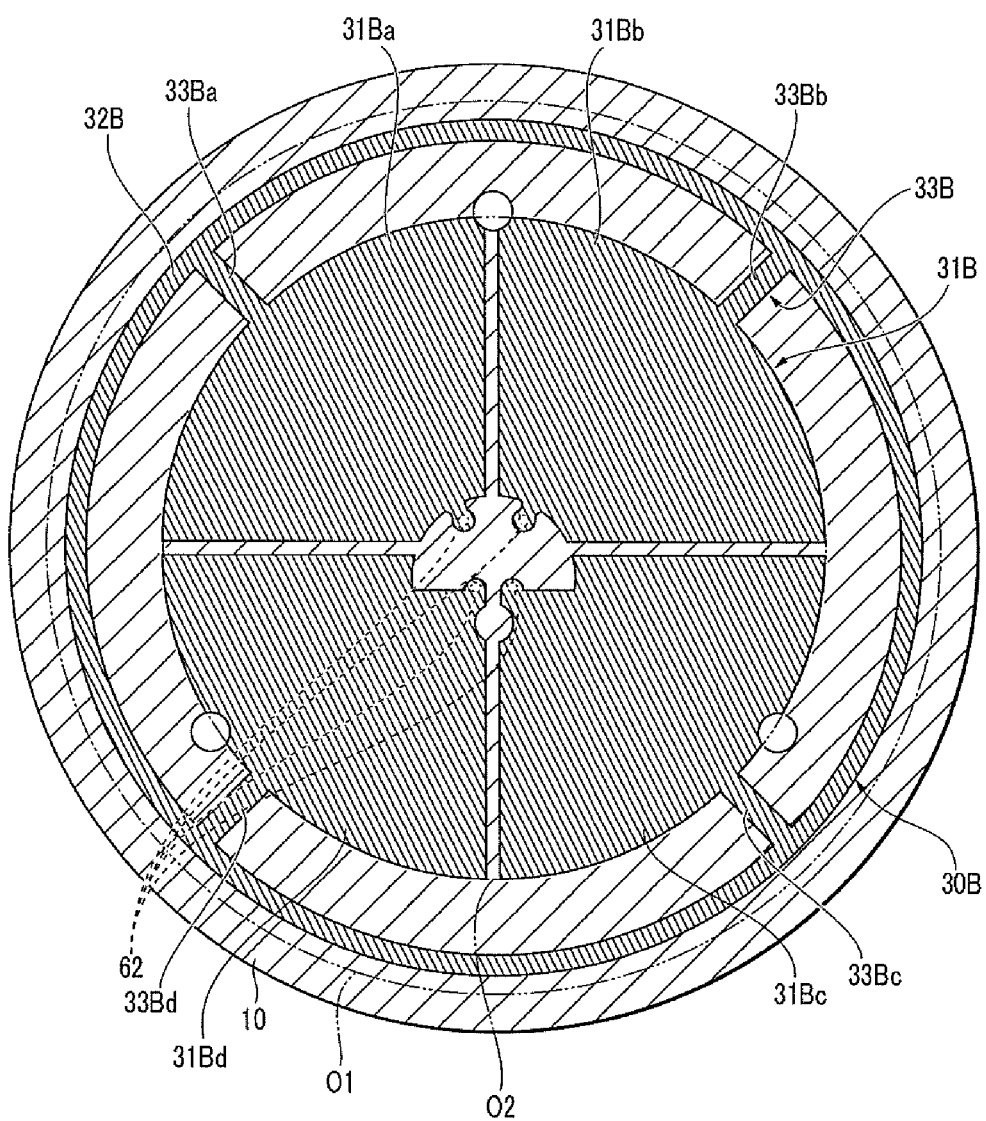
FIG. 6 is a schematic cross-sectional view of another modification of the ceramic heater as taken along line IV-IV of FIG. 1.

As another modification example, a top-side heating resistor 30B is provided as shown in FIG. 6, which includes: a top-side first resistive portion 31B having four top-side first resistive elements 31Ba to 31Bd respectively connected to the top-side heating resistor terminals 62; a top-side second resistive portion 32B having one annular second resistive element located radially outward of the top-side first resistive portion 31B; and a top-side connecting portion 33B having top-side connecting resistive elements 33Ba to 33Bd to respectively connect the top-side first resistive elements 31Ba to 31Bd to the top-side second resistive portion 32B. In top view, the top-side first resistive elements 31Ba to 31Bd are substantially sector-shaped and have respective circumferential contour lines along the circumference of an imaginary circle O2 coaxial with the disc-shaped ceramic substrate 10.

The top-side second resistive portion 32B may alternatively be provided with a plurality of semi-annular and/or linear resistive elements by reference to FIG. 4 although the top-side second resistive portion 32B has one annular resistive element in the modification example of FIG. 6.

The top-side first resistive element 31*a*, 31*b* of the top-side first resistive portion 31 is not necessarily connected to the top-side second resistive portion 32 by one top-side connecting resistive element 33*a*, 33*b* of the top-side connecting portion 33. Two or more top-side connecting resistive elements may alternatively be provided for connection of the top-side first resistive element 31*a*, 31*b* of the top-side first resistive portion 31 to the top-side second resistive portion 32.

Figure 7:
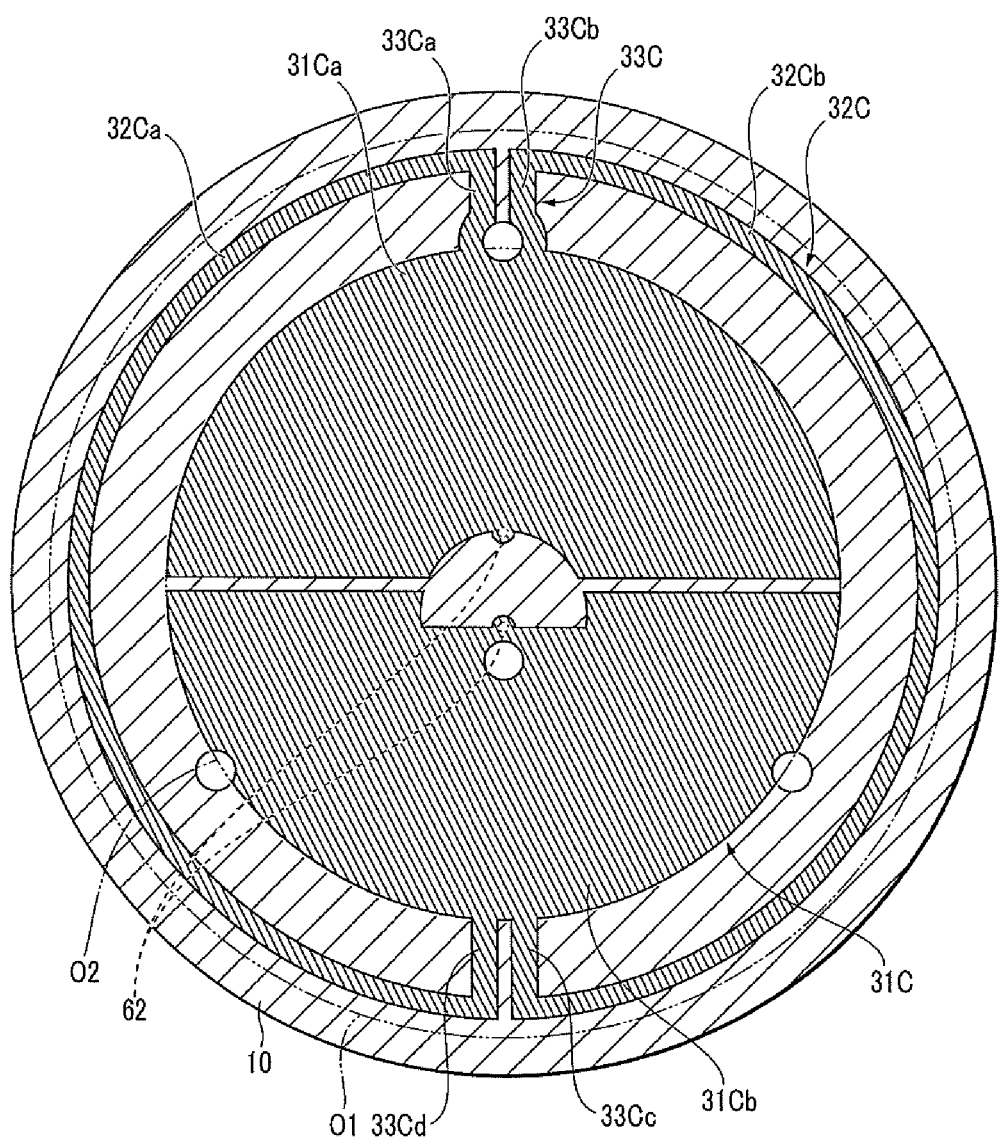
FIG. 7 is a schematic cross-sectional view of still another modification of the ceramic heater as taken along line IV-IV of FIG. 1.

In FIG. 7, provided is another modification example of the top-side heating resistor in which each top-side first resistive element of the top-side first resistive portion is connected to the top-side second resistive portion by two top-side connecting resistive elements. In this modification example, the top-side heating resistor includes a top-side first resistive portion 31C with top-side first resistive elements 31Ca and 31Cb, a top-side second resistive portion 32C with top-side second resistive elements 32Ca and 32Cb and a top-side connecting resistive portion 33C with top-side connecting resistive elements 33Ca to 33Cd such that outer circumferential end parts of the top-side first resistive element 31Ca are connected to one ends of the top-side second resistive elements 32Ca and 32Cb (on the upper side of FIG. 7) by the top-side connecting resistive elements 33Ca and 33Cb and such that outer circumferential end parts of the top-side first resistive element 31Cb are connected to the other ends of the top-side second resistive elements 32Ca and 32Cb (on the lower side of FIG. 7) by the top-side connecting resistive elements 33Cd and 33Cc.

Figure 8:
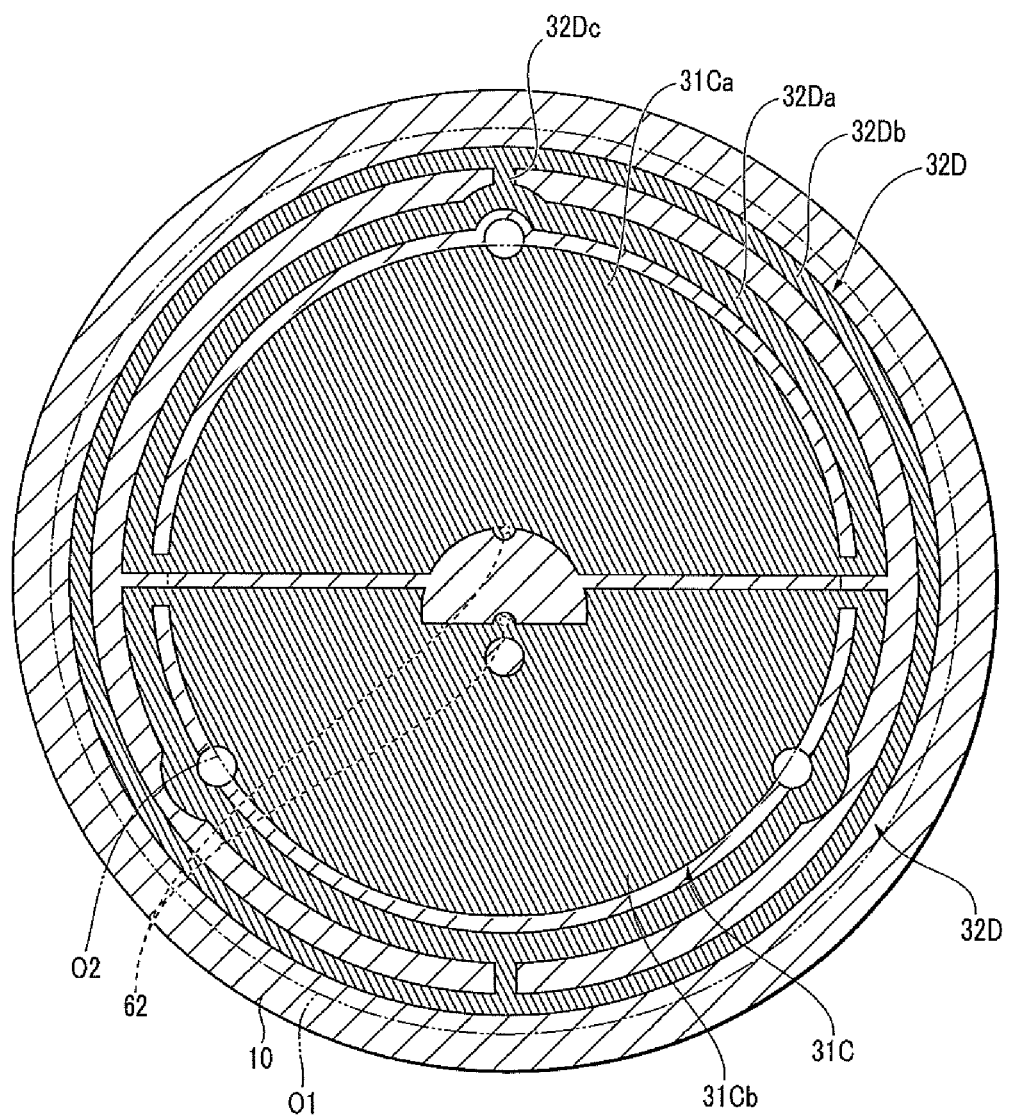
FIG. 8 is a schematic cross-sectional view of yet another modification of the ceramic heater as taken along line IV-IV of FIG. 1.

In the modification example of FIG. 7, the top-side first resistive element 31Ca (31Cb) of the top-side first resistive portion 31C is substantially semicircular plate-shaped and connected at substantially middle points on the circular-arc circumference thereof to the top-side connecting resistive elements 33Ca and 33Cb (33Cc and 33Cd) of the top-side connecting portion 33C. The points of connection of the top-side first resistive element 31Ca (31Cb) to the top-side connecting resistive elements 33Ca and 33Cb (33Cc and 33Cd) are however not limited to those shown in FIG. 7. For example, the top-side first resistive element 31Ca (31Cb) may alternatively be connected at both ends on the the circular-arc outer circumference thereof to the top-side connecting resistive elements 33Ca and 33Cb (33Cc and 33Cd) by reference to FIG. 8. As shown in FIG. 8, a top-side second resistive portion 32D may be provided in which resistive elements 32Da, 32Db and 32Dc are arranged in a branched form by combination of the configurations of FIGS. 4 to 7.

The configuration of the bottom-side heating resistor 40 will be explained in detail below with reference to FIG. 9.

Figure 9:
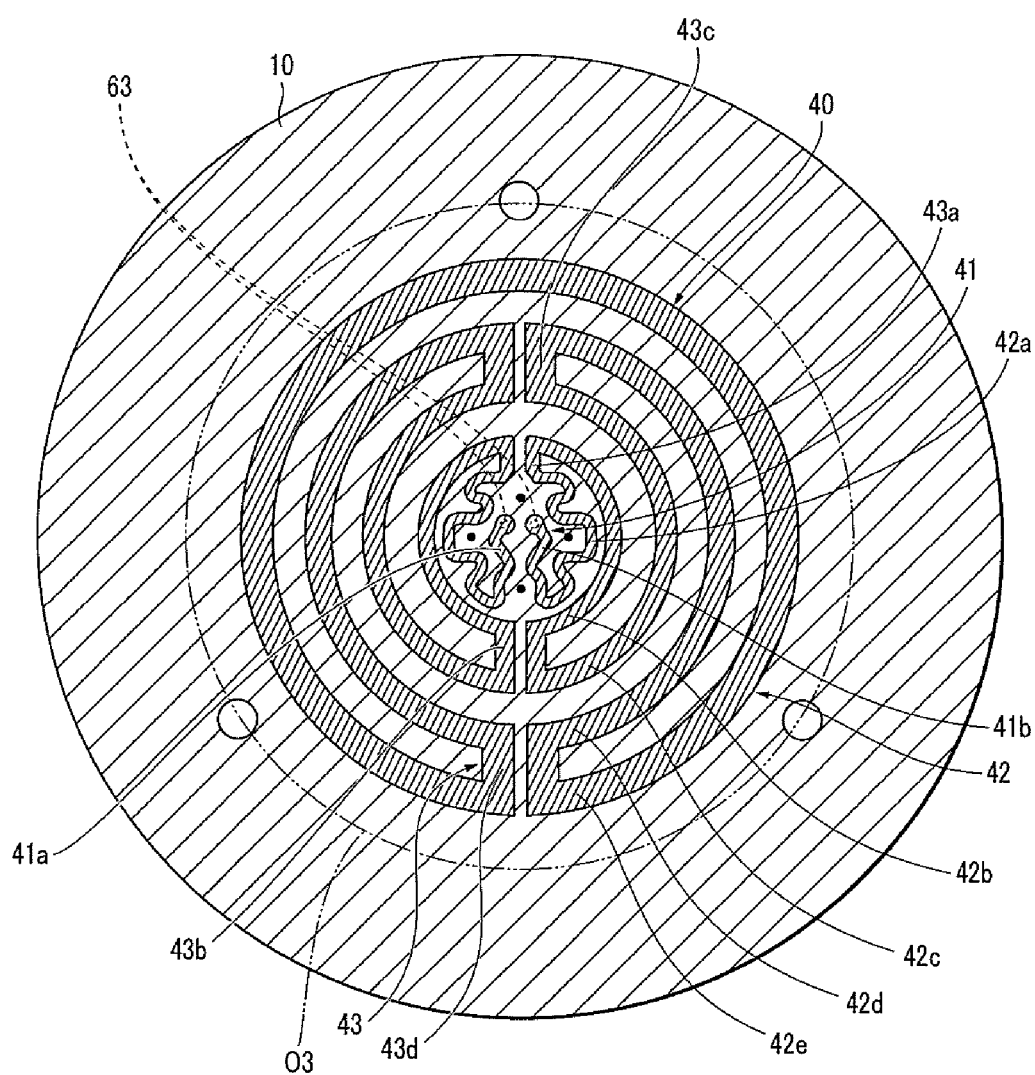
FIG. 9 is a schematic cross-sectional view of the ceramic heater as taken along line IX-IX of FIG. 1.

As shown in FIG. 9, the bottom-side heating resistor 40 includes a bottom-side first resistive portion 41 connected to the bottom-side heating resistor terminals 63, a bottom-side second resistive portion 42 connected to and located radially outward of the bottom-side first resistive portion 41, and a bottom-side connecting resistive portion 43 connecting adjacent elements of the bottom-side second resistive portion 42 to each other. In top view, the bottom-side heating resistor 40 is arranged inside an imaginary circle C3 defined by an innermost circumferential contour of the top-side second resistive portion 32 of the top-side heating resistor 30.

More specifically, the bottom-side first resistive portion 41 has two bottom-side first resistive elements 41*a* and 41*b*. The bottom-side first resistive elements 41*a* and 41*b* are formed in a wavy, bent or meandering shape and connected at one ends thereof to the respective bottom-side heating resistor terminals 63. The bottom-side first resistive elements 41*a* and 41*b* may alternatively be formed in a straight shape although each of the bottom-side first resistive elements 41*a* and 41*b* is wavy-, bent- or meandering-shaped to avoid temperature sensor parts (indicated by black dots in FIG. 9) in the present embodiment.

The bottom-side second resistive portion 42 has a plurality of pairs of bottom-side second resistive elements disposed in a multiple annular arrangement around the bottom-side first resistive portion 41. In the present embodiment, five pairs of bottom-side second resistive elements 42*a* to 42*e* are provided radially separately from one another. The innermost pair of bottom-side second resistive elements 42*a* are formed in a wavy, bent or meandering shape to avoid the temperature sensor parts as in the case of the bottom-side first resistive elements 41*a* and 41*b*. The other bottom-side second resistive elements 42*b*, 42*c*, 42*d* and 42*e* are substantially semi-annular strip-shaped such that each pair of bottom-side second resistive element 42*b*, 42*c*, 42*d*, 42*e* extends along a circle coaxial with the disc-shaped ceramic substrate 10.

The bottom-side connecting resistive portion 43 has four bottom-side connecting resistive elements 43*a* to 43*d* formed in a short strip shape and connecting opposed ends of alternate adjacent ones of the bottom-side second resistive elements 42a to 42e.

The bottom-side heating resistor 40 is not limited to the above configuration. For example, the bottom-side second resistive elements 42b to 42e and/or the bottom-side connecting resistive elements 43a to 43d may be in a wavy, bent or meandering shape.

A plurality of bottom-side heating resistors 40 may be provided in layers in the thickness direction of the ceramic substrate 10. The bottom-side heating resistor 4 can be of the same configuration as those of the conventional ceramic heater.

In the conventional ceramic heater, the top-side first resistive portion (top-side first resistive element) is arranged in a linear or strip shape with the same or similar width to the top-side connecting portion (top-side connecting resistive elements) so as to connect the top-side heating resistor terminals to the top-side second resistive portion, whereby uniformity of heat on the ceramic substrate is interfered with by unavoidable Joule heat generation from the top-side first resistive portion.

In the ceramic heater 100, by contrast, the top-side first resistive portion 31 (top-side first resistive element 31a, 31b) is arranged in a planar shape and hence made larger in area and lower in electrical resistance than in the conventional ceramic heater. Therefore, the ceramic heater 100 suppresses heat generation from the top-side first resistive portion 31 and achieves uniformity of heat on the ceramic substrate 10. In particular, the top-side heating resistor 30 has a metal layer at substantially the entire surface thereof. As the reflectivity of the metal layer is high, the top-side first resistive portion 31 performs the function of reflecting Joule heat generated from the bottom-side heating resistor 40 and suppressing heat release to the shaft 50. This function also contributes to uniformity of heat.

As mentioned above, the ceramic substrate 10 is formed by sintering the ceramic material powder with the electrode 20 and the heating resistors 30 and 40 being embedded in the ceramic material powder. In the case of using an aluminum nitride (AlN) powder or aluminum oxide ($Al_2O_3$) powder as the raw ceramic material powder of the ceramic substrate 10, for example, the ceramic material powder may be subjected to granulation with an organic solvent. Further, the ceramic material powder may be mixed with an organic binder and then molded into a desired shape. In these cases, a carbon component derived from the organic solvent, organic binder etc. is slightly contained in the ceramic material powder.

During the sintering, the carbon component contained in the ceramic material powder is reacted with the electrode 20 and the heating resistors 30 and 40. Consequently, the heating resistors 30 and 40 show respective desired resistance values.

In the case where a heating resistor of the same configuration as the bottom-side heating resistor 40 is provided as a second heating resistor between the planer electrode 20 and the planer top-side first resistive portion 31 of the top-side heating resistor 30, the carbon component contained in the ceramic material powder is consumed by reaction with the planer electrode 20 and the planer top-side first resistive portion 31 so that this second heating resistor fails to show a desired resistance value due to less amount of carbon component reacted therewith.

In the present embodiment, however, no planer electrode and no planer heating resistor (resistive portion) are present below the bottom-side heating resistor 40. As sufficient carbon component is reacted with the bottom-side heating resistor 40 during the sintering, the bottom-side heating resistor 40 shows a desired resistance value.

Although the present invention has been described with reference to the above embodiment and modification examples, the above embodiment and modification examples are intended to facilitate understanding of the present invention and are not intended to limit the present invention thereto. Various changes and modifications can be made to the above embodiment and modification examples without departing from the scope of the present invention.

For example, the present invention is not limited to the above-embodied ceramic heater 100 with two top- and bottom-side heating resistors 30 and 40 and may have at least one additional heating resistor located below the bottom-side heating resistor 40, between the top- and bottom-side heating resistors 30 and 40 or above the top-side heating resistor 30.

The entire contents of Japanese Patent Application No. 2018-087990 (filed on May 1, 2018) are herein incorporated by reference. The scope of the present invention is defined with reference to the following claims.

What is claimed is:

1. A ceramic heater, comprising: a ceramic substrate formed of a ceramic material in a circular disc shape with top and bottom surfaces; a planar electrode embedded in the ceramic substrate and configured as an electrostatic attraction electrode or a high-frequency generation electrode; a first heating resistor embedded in the ceramic substrate at a position closer to the bottom surface of the ceramic substrate than the planar electrode; and a second heating resistor embedded in the ceramic substrate at a position closer to the bottom surface of the ceramic substrate than the first heating resistor, wherein the first heating resistor has, in top view, a planar first resistive portion arranged in an inner region inside a first imaginary circle defined by an outermost circumferential contour of the planar electrode, a linear or strip-shaped second resistive portion arranged in the inner region at a position outward of the first resistive portion in a radial direction of the ceramic substrate and extending along a circumferential direction of the ceramic substrate, and a connecting portion connecting the first resistive portion and the second resistive portion to each other, and wherein, in top view, the second heating resistor is arranged inside a second imaginary circle defined by an innermost circumferential contour of the second resistive portion.

2. The ceramic heater according to claim 1, wherein, in top view, the first resistive portion includes a plurality of sections having respective contour lines along a circumference of a circle coaxial with the ceramic substrate and being electrically connected to each other via the second resistive portion and the connection portion.

3. The ceramic heater according to claim 1, wherein, in top view, a total area of the first resistive portion is 50% or larger assuming that an area of a third imaginary circle defined by an outermost circumferential contour of the first resistive portion is 100%.

* * * * *